(12) United States Patent  
Noy

(10) Patent No.: US 6,219,809 B1
(45) Date of Patent: Apr. 17, 2001

(54) SYSTEM AND METHOD FOR APPLYING FLEXIBLE CONSTRAINTS

(75) Inventor: Amos Noy, Jerusalem (IL)

(73) Assignee: Verisity Ltd., Rosh Haayin (IL)

( * ) Notice: Subject to any disclaimer, the term of this patent is extended or adjusted under 35 U.S.C. 154(b) by 0 days.

(21) Appl. No.: 09/259,276

(22) Filed: Mar. 1, 1999

(51) Int. Cl.$^7$ .................................................. G01R 31/28
(52) U.S. Cl. .............................................. 714/724; 703/13
(58) Field of Search ..................... 714/741, 724, 714/738, 33, 37, 39; 703/13, 14, 21, 22, 23; 712/227

(56) References Cited

U.S. PATENT DOCUMENTS

| | | | | |
|---|---|---|---|---|
| 5,202,889 | * | 4/1993 | Aharon et al. ........................ | 714/739 |
| 5,657,256 | * | 8/1997 | Swanson et al. ..................... | 702/119 |
| 5,703,789 | * | 12/1997 | Beausang et al. .................... | 364/489 |
| 5,781,432 | * | 7/1998 | Keeler et al. ........................ | 364/164 |

* cited by examiner

Primary Examiner—Christine T. Tu
(74) Attorney, Agent, or Firm—Mark M. Friedman

(57) ABSTRACT

The method of the present invention determines constraints which should be applied to data structures, and then applies the constraints during the test generation process. The constraint is applied according to an internal logical order of application. Each constraint of the sequence of constraints is defined. Then a constraint is applied to a data structure for at least reducing the range of possible values, even the possible values are not restricted to one such value. This process is then repeated for other constraints in the sequence. The first constraint in the sequence or at least an earlier constraint in the sequence, is then re-applied, in order to further restrict the range of possible values, and so forth. During this process, preferably the order of suitable application is also determined, such that a constraint which cannot be applied because it requires values which have not yet been defined, is only applied after other constraint(s) which supply the missing values. The process is preferably repeated until no further restrictions can be placed on the range of potential values, more preferably until one such value is determined if possible.

12 Claims, 3 Drawing Sheets

SYSTEM AND METHOD FOR APPLYING FLEXIBLE CONSTRAINTS

FIELD AND BACKGROUND OF THE INVENTION

The present invention relates to a system and method for applying flexible generation constraints, and in particular, to a system and method for applying such complex constraints to a functional verification programming environment during test generation.

Design verification is the process of determining whether an integrated circuit, board, or system-level architecture, exactly implements the requirements defined by the specification of the architecture for that device. Design verification for a device under testing (DUT) may be performed on the actual device, or on a simulation model of the device. For the purposes of explanation only and without intending to be limiting in any way, the following discussion centers upon testing which is performed on simulation models of the device.

As designs for different types of devices and device architectures become more complex, the likelihood of design errors increases. However, design verification also becomes more difficult and time consuming, as the simulation models of the design of the device also become more complex to prepare and to test.

The problem of design verification is compounded by the lack of widely generalizable tools which are useful for the verification and testing of a wide variety of devices and device architectures. Typical background art verification methods have often been restricted to a particular device having a specific design, such that the steps of preparing and implementing such verification methods for the simulation model must be performed for each new device.

The process of verifying a design through a simulation model of the device is aided by the availability of hardware description languages such as Verilog and VHDL. These languages are designed to describe hardware at higher levels of abstraction than gates or transistors. The resultant simulated model of the device can receive input stimuli in the form of test vectors, which are a string of binary digits applied to the input of a circuit. The simulated model then produces results, which are checked against the expected results for the particular design of the device. However, these languages are typically not designed for actual verification. Therefore, the verification engineer must write additional programming code in order to interface with the models described by these hardware description languages in order to perform design verification of the device.

Examples of testing environments include static and dynamic testing environments. A static testing environment drives pre-computed test vectors into the simulation model of the DUT and/or examines the results after operation of the simulation model. In addition, if the static testing environment is used to examine the results output from the simulation model, then errors in the test are not detected until after the test is finished. As a result, the internal state of the device at the point of error may not be determinable, requiring the simulation to be operated again in order to determine such internal states. This procedure consumes simulation cycles, and can require the expenditure of considerable time, especially during long tests.

A more useful and efficient type of testing is a dynamic testing environment. For this type of environment, a set of programming instructions is written to generate the test vectors in concurrence with the simulation of the model of the DUT and while potentially being controlled by the state feedback of the simulated device. This procedure enables directed random generation to be performed and to be sensitive to effects uncovered during the test itself on the state of the simulation model of the device. Thus, dynamic test generation clearly has many advantages for design verification.

Within the area of testing environments, both static and dynamic testing environments can be implemented only with fixed-vector or pre-generation input. However, a more powerful and more sophisticated implementation uses test generation to produce the environment. Such test generation involves the production of a random or pseudo-random testing environment, either through a custom generator program or else through a configurable generator. The custom generator program poses difficulties for reuse, in that it is typically designed for one specific hardware device as the DUT, and as such may be difficult or impossible to use for other devices.

Configurable generators can be further divided into two subcategories: template-based generators and constraint-based generators. Template-based generators for producing testing environments are domain specific, in the sense that they are only useful for certain types of hardware. If the device under test does not fit into the requirements of the template, then the template-based testing environment is not useful. For example, U.S. Pat. No. 5,202,889 discloses a process for generating biased pseudo-random test patterns for testing the design of an integrated circuit such as a microprocessor. However, as disclosed this process is heavily dependent upon the pre-defined templates produced for the particular architecture and function of the hardware, such as interactions with registers, and as such would be difficult to generalize to all types of test generation for different DUT's. Furthermore, the disclosed process does not feature constraints or other relatively complex test generation expressions, further limiting the possible scope of the disclosed method for test generation.

Constraint-based generators, by contrast, are able to accommodate many different types of hardware, rather than hardware in a particular domain. One example of such a constraint-based test generation procedure is disclosed in U.S. patent application Ser. No. 09/020,792, filed on Feb. 6, 1998, incorporated by reference as if fully set forth herein. This test generation procedure interacts with, and sits as a higher level over, such hardware description languages as Verilog and VHDL. The test generation procedure is written in a hardware-oriented verification specific object-oriented programming language. This language is used to write various tests, which are then used to automatically create a device verification test by a test generator module. A wide variety of design environments can be tested and verified with this language. Thus, the disclosed procedure is generalizable, yet is also simple to program and to debug by the engineer.

The disclosed language features a number of elements such as structs for more richly and efficiently describing the design of the device to be simulated by the model. Structs are compound data structures. A struct definition is the basic data abstraction mechanism used to encapsulate data, data-relations and procedural activity in one single entity. A struct can therefore also be described as an object-oriented programming class. Each struct features one or more fields for storing data.

Among the disclosed features of the test generation procedure is the possibility to specify declarative relations between fields of a struct as constraints. Constraints are directives for the test generation. For example, type constraints are declared in the context of a struct, and are used to impose constraints on the values generated for the fields in a struct. A constraint can be used to restrict the possible values generated for fields in a particular run of a test. The restriction can narrow the choice to a single value, or to a range of possible values. Thus, the addition of constraints can direct and restrict the test generation procedure.

Unfortunately, as disclosed in U.S. patent application Ser. No. 09/020,792, these constraints are only operative according to the order of presentation, rather than according to any flexible, "logical" order. Therefore, the disclosed constraints are rigid in nature, in the sense that altering the order of presentation of the constraints may change the outcome of applying these constraints, according to the disclosure of U.S. patent application Ser. No. 09/020,792. Thus, as disclosed, these constraints clearly have disadvantages.

A useful combination of these different types of testing environments would feature a flexible environment which is not domain specific, such that the environment would be suitable for many different types of hardware for the DUT. This flexible environment would feature dynamic test generation "on the fly", such that the environment would not be restricted to testing factors which were pre-computed or pre-generated. Finally, the test generation procedure for producing this testing environment would permit constraints to be applied according to the internal logical order, rather than according to the order of presentation, such that the order of presentation of the constraints does not necessarily determine the outcome of applying these constraints. Unfortunately, such test generation software for producing such a testing environment does not exist.

Therefore, there is an unmet need for, and it would be highly useful to have, a system and method for flexible constraints for test generation, such that constraints could be applied with a variety of different field structures on any level, including complex structures such as fields and lists, and such that the order of presentation of the constraints does not necessarily determine the outcome of applying such constraints, but rather that the constraints are applied according to an internal logical order.

SUMMARY OF THE INVENTION

The system and method of the present invention includes a simulation model with at least one flexible constraint on a data structure. The term "flexible constraint" indicates that the constraint is not limited to any one type of data structures, but instead can be used for any type of data structure. The preferred data structures include an object, a list of objects, a list of scalars and a mixture of at least two types of such structures. An object includes at least one data element and optionally includes a function for operating on the data element. The data element in turn could be a scalar or another object, for example. Preferably, the data structure is not a single scalar.

The method of the present invention determines each constraint, of a sequence of constraints, which should be applied to the data structure, and then applies the constraint during the test generation process. However, the constraint is preferably not applied according to the order of constraints in the sequence, but rather is applied according to an internal logical order of application. Since these constraints are effectively order-independent in terms of the order of presentation, each constraint is potentially bi-directional, in the sense that the definitions of the "constraint condition" and the "data structure to which the constraint should be applied" are flexible and can be reversed.

In order to apply these constraints according to the logical internal order, preferably the following steps are performed. First, each constraint of the sequence of constraints is defined. Next, a constraint is applied to a data structure for at least reducing the range of possible values, even the possible values are not restricted to one such value. This process is then repeated for other constraints in the sequence. The first constraint in the sequence (or at least an earlier constraint in the sequence) is then re-applied, in order to further restrict the range of possible values, and so forth. During this process, preferably the order of suitable application is also determined, such that a constraint which cannot be applied, for example because it requires values which have not yet been defined, is only applied after other constraint(s) which supply the missing values. The process is preferably repeated until no further restrictions can be placed on the range of potential values, more preferably until one such value is determined if possible.

According to the present invention, there is provided a method for test generation with a plurality of constraints on at least one data structure of a simulation model, the at least one data structure having at least one possible value, the steps of the method comprising: (a) an alyzing the plurality of constraints to determine an internal logic order for a sequence of constraints, each of the plurality of constraints being of a form such that the at least one possible value is selected from a non-random set containing at least one value, the internal logic order being determined according to an ability to restrict a range of potential values for the non-random set for each of the plurality of constraints after applying a previous constraint in the sequence of constraints; (b) determining each of the plurality of constraints for the at least one data structure of the model according to the sequence of constraints; and (c) applying each of the plurality of constraints to the at least one data structure to perform the test generation.

Preferably, at least one constraint of the plurality of constraints is a flexible constraint. More preferably, the range of potential values includes a plurality of values. Alternatively and preferably, the at least one data structure of the model is an object including at least one data element and at least one function for operating on the at least one data element. More preferably, the object further includes at least one internal constraint being internal to the object for constraining the at least one data element of the object, and the step of applying the constraint to the object includes the steps of: (i) applying the at least one internal constraint to the at least one data element of the object; and (ii) applying the constraint to the at least one data element of the object, such that a non-random set of at least one value for the at least one data element of the object is first determined according to the internal constraint before being determined according to the constraint.

Preferably, the at least one data structure of the model is a list of a plurality of objects. More preferably, at least one of the plurality of objects in the list further includes at least one internal constraint being internal to the at least one of the plurality of objects for constraining the at least one data element of the at least one of the plurality of objects, and the step of applying the constraint to the list of the plurality of objects includes the steps of: (i) applying the at least one internal constraint to the at least one data element of the at least one of the plurality of objects; (ii) applying the constraint to the at least one data element of the at least one of the plurality of objects, such that if the internal constraint is present, a non-random set of at least one value for the at least one data element of the at least one of the plurality of objects is first determined according to the internal constraint before being determined according to the constraint; and (iii) repeating at least step (ii) for substantially all of the plurality of objects.

Preferably, the at least one data structure of the model is a list of a plurality of scalars. More preferably, the step of applying the constraint to the list of the plurality of scalars includes the step of sequentially applying the constraint to each of the plurality of scalars in the list.

Also preferably, the range of potential values includes a single value.

Preferably, the step of analyzing the plurality of constraints includes the step of identifying at least one of the plurality of constraints for being determined after at least one constraint is applied to the at least one data structure, such that at least a portion of the test generation is performed before the at least one constraint is determined.

Also preferably, the plurality of constraints are analyzed according to a presentation order, the presentation order being different from the internal logic order.

Hereinafter, the term "computing platform" refers to a particular computer hardware system or to a particular software operating system. Examples of such hardware systems include, but are not limited to, personal computers (PC), Macintosh™ computers, mainframes, minicomputers and workstations. Examples of such software operating systems include, but are not limited to, UNIX, VMS, Linux, MacOS™, DOS, FreeBSD, one of the Windows™ operating systems by Microsoft Inc. (Seattle, Wash., USA), including Windows NT™, Windows 3.x™ (in which "x" is a version number, such as "Windows 3.1™") and Windows95™.

The method of the present invention could also be described as a plurality of instructions being performed by a data processor, such that the method of the present invention could be implemented as hardware, software, firmware or a combination thereof. For the present invention, a software application could be written in substantially any suitable programming language, which could easily be selected by one of ordinary skill in the art. The programming language chosen should be compatible with the computing platform according to which the software application is executed. Examples of suitable programming languages include, but are not limited to, C, C++ and Java.

Hereinafter, the term "non-random" refers to a process, or an entity selected by the process, which is not random but which is not necessarily deterministic.

BRIEF DESCRIPTION OF THE DRAWINGS

The invention is herein described, by way of example only, with reference to the accompanying drawings, wherein.

DESCRIPTION OF THE PREFERRED EMBODIMENTS

The system and method of the present invention includes a simulation model with at least one flexible constraint on a data structure. The term "flexible constraint" indicates that the constraint is not limited to any one type of data structures, but instead can be used for any type of data structure. The preferred data structures include an object, a list of objects and a list of scalars. An object includes at least one data element and a function for operating on the data element. The data element in turn could be a scalar or another object, for example. Preferably, the data structure is not a single scalar.

The method of the present invention defines a plurality of constraints, and then determines the order in which the constraints should be applied to each data structure. The order of application depends upon the nature of the constraint, and in particular for the information which is required for applying the constraint, such that the order of application is determined according to an internal logical order, rather than according to the order of presentation of the constraints After application of the constraint to the data structure, the range of potential values for that data structure should be restricted. The process is preferably repeated until no further restrictions to the range of potential values are possible. More preferably, the process is repeated for all constraints in the sequence of the plurality of constraints.

The principles and operation of the flexibly ordered constraint test generation system and method according to the present invention may be better understood with reference to the drawings and the accompanying description.

Figure 1:
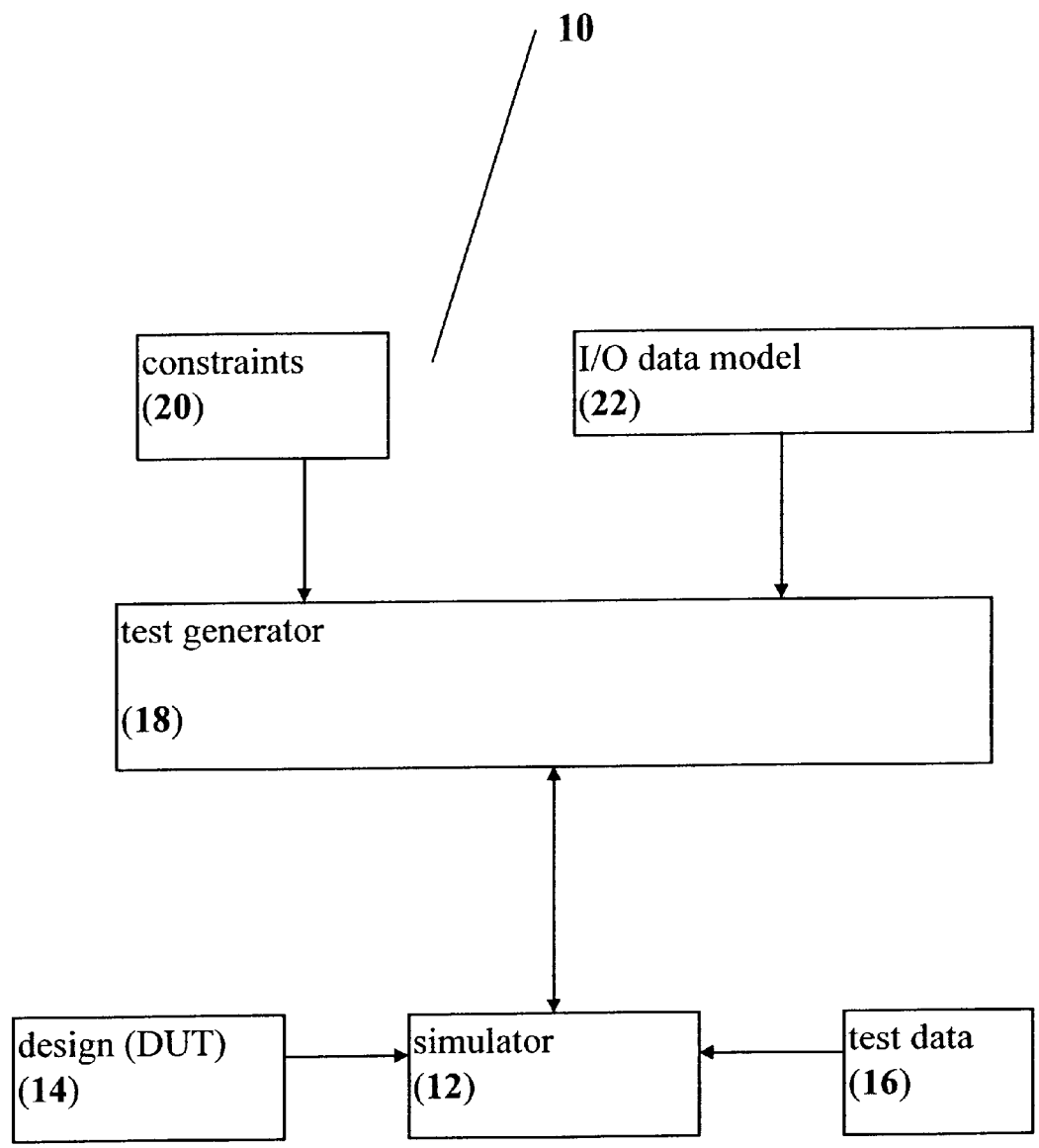
FIG. 1 is a schematic block diagram illustrating an exemplary system according to the present invention.

Referring now to the drawings, FIG. 1 is a schematic block diagram illustrating an exemplary system according to the present invention for test generation. It should be noted that the illustrated system only includes those functions of the test generation procedure which are required for the description of the present invention. A more complete description of the entire test generation procedure may be found in U.S. patent application Ser. No. 09/020,792, previously incorporated by reference.

A test generation system 10 features a simulator 12, which may accept a design 14 for the device under test (DUT), written in a hardware descriptive language such as Verilog or VHDL. Optionally C test data 16 is also accepted as an input. In addition, simulator 12 interacts with a test generator 18 for performing the test generation procedure. The interaction between simulator 12 and test generator 18 is shown as bidirectional, since test generator 18 provides input to simulator 12, and in turn receives the results from simulator 12 as input for further operation.

Test generator 18 also receives one or more constraints 20 and an I/O data model 22. According to a preferred embodiment of the present invention, and as described in further detail below, constraints 20 and I/O data model 22 are preferably constructed in e code, which is the code language provided by the Specman™ functional programming environment (Verisity Design, Inc., Mountain View, Calif., USA) and disclosed in U.S. patent application Ser. No. 09/020,792. Such an embodiment is preferred because of the ease and flexibility of programming in e code. The following description centers upon this preferred embodiment, it being understood that this is for the purposes of description only and is not meant to be limiting in any way.

Figure 2:
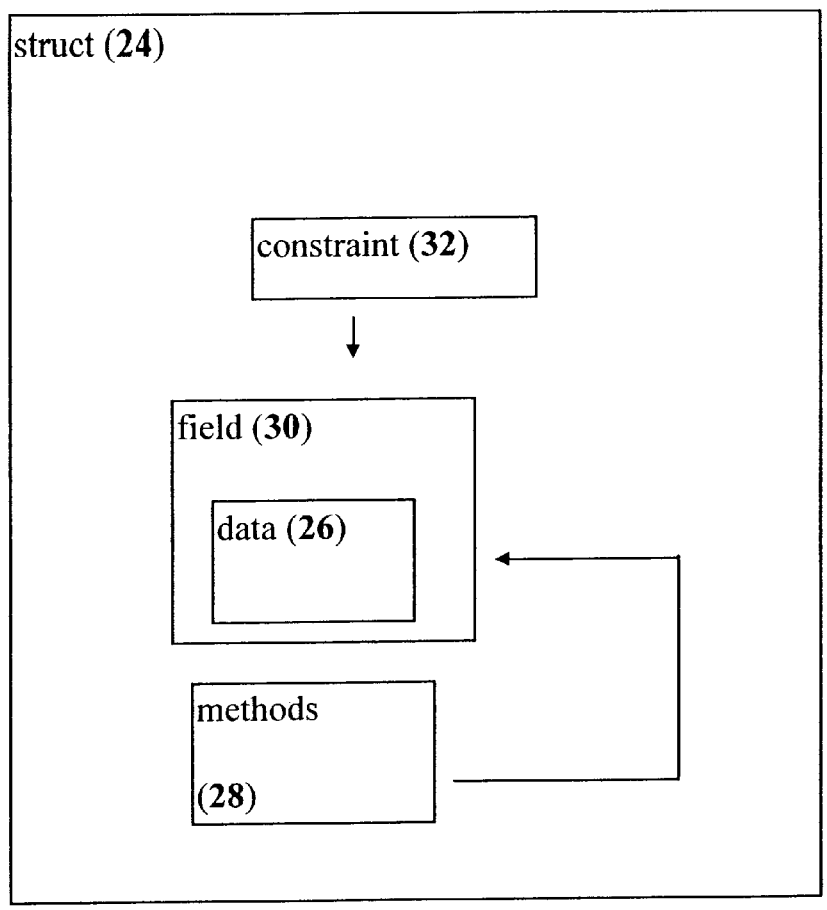
FIG. 2 is a schematic block diagram illustrating an exemplary struct for use with the system of FIG. 1 according to the present invention.

The e code language is a hardware-oriented verification specific object-oriented programming language. Objects in this language are instances of "structs". An exemplary struct 24 is shown in FIG. 2. Struct 24 contains both a field 30 and one or more functions, shown as methods 28, which operate on data 26 stored within field 30 and which interact with other objects. A constraint 32 is shown as operating on field 30, thereby altering data 26 stored in field 30, for example by restricting the range of possible values for data 26. Field 30 can also be used to store more complex structures, including other structs and lists of scalars or structs.

Figure 3:
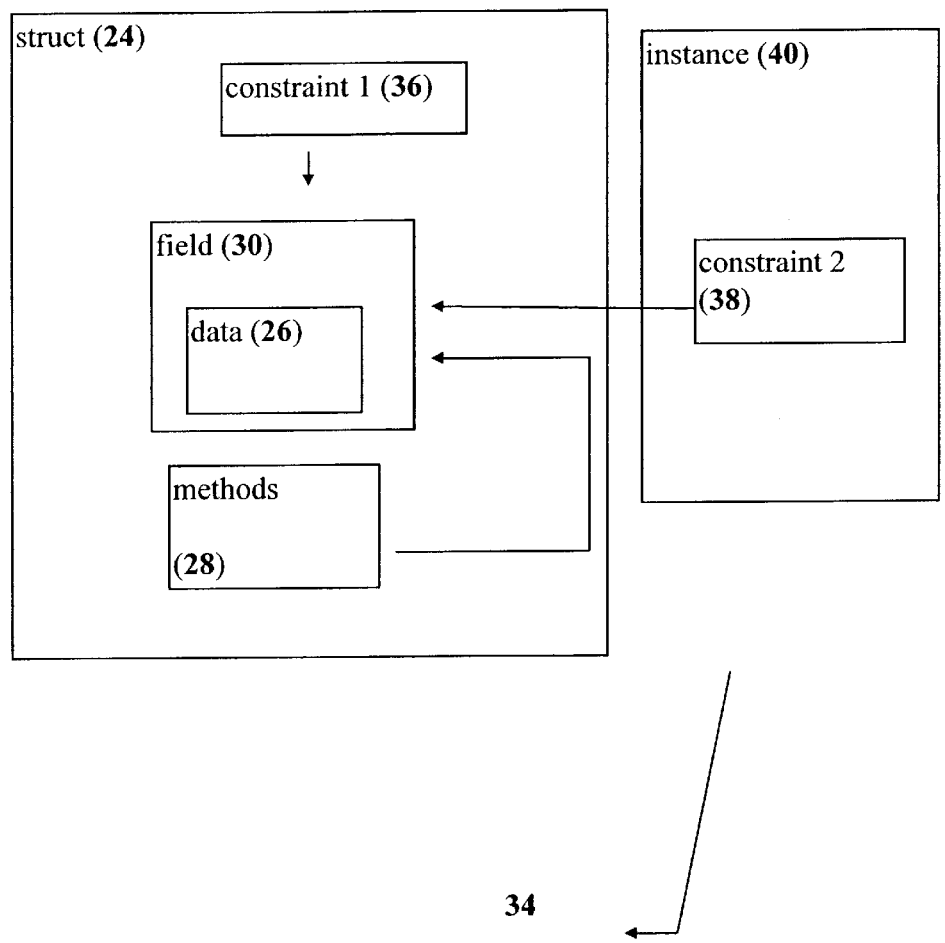
FIG. 3 is a schematic block diagram illustrating an exemplary system of constraints for use with the struct of FIG. 2.

Constraint 32 is one of a plurality of such constraints 32 which are applied throughout the test generation system, as shown in FIG. 3, which is a schematic block diagram of an exemplary test generation system 34. In FIG. 3, two constraints are shown, a first constraint (labeled as "constraint 1") 36 and a second constraint (labeled as "constraint 2") 38. First constraint 36 is contained within struct 24, and constrains data 26 contained within field 30 for all instances of struct 24. In addition, a specific instance 40 of struct 24 contains second constraint 38, also for constraining data 26 contained within field 30. However, second constraint 38 constrains data 26 for instance 40 only. Thus, second constraint 38 is instance-specific, while first constraint 36 is applicable for any instance of struct 24.

According to the method and system of the present invention, the order in which first constraint 36 and second constraint 38 are applied to data 26 in field 30 is not necessarily the order of presentation within the program. In other words, within the test generation program itself, the order of presentation is to apply first constraint 36 (as a general constraint for all instances of struct 24) first, and then to apply second constraint 38 (as an instance-specific constraint). However, depending upon the nature of first constraint 36 and second constraint 38, the internal logical order may be to apply second constraint 38 before first constraint 36. Such an internal logical order is not the same as the presentation order for this example, yet the constraints can be applied according to this internal logical order in the method and system of the present invention, as shown in the examples below.

This latter feature is particularly important for the method and system of the present invention, since according to background art implementations, constraints could only be applied in the order of presentation. Since certain constrains may be more effectively applied according to an internal logical order which is different than the order of presentation, this limitation of the background art prevented completely logical application of the constraints, thereby limiting the efficacy of these constraints.

As noted previously, constraints are very important for random directed test generation according to the present invention. The process of test generation fills data elements, including structs and fields, with random values. The possible data values for each element can be limited by constraints, which provide the direction for the directed test generation. The following section describes a number of illustrative command structures for creating constraints in the e code language, it being understood that these command structures are only being given for the purposes of illustrating a particularly preferred embodiment of the present invention.

For the present invention, the simplest form of the constraint command is in the form "keep {expr; . . .}", in which one or more expressions are located between the brackets. These expressions can include any type of field of a struct, and thus are widely generalizable to any type of data. Furthermore, the expression expr could be a range of permissible values rather than a single value. The constraint command is employed within the struct itself. For example, the following portion of code illustrates the "keep" constraint command with the implication operator "=>":

keep expression1=>expression2

This constraint means that "expression1 implies expression2" or "when expression1 (is true) then also expression2 (is true)". However, expression2 can be true even if expression1 is not true.

Such an implication operator command is relatively simple to implement with scalar values in the expressions expression1 and expression2. If both expressions are scalars, for example "a==1" and "b==4", respectively, and if expression1 ("a==1") is true, then expression2 ("b==4") is also true.

However, if expression1 is a struct, and expression2 is a list of scalars, for example, implementation becomes relatively difficult. In this case, first any constraints within the struct forming expression1 would need to be evaluated, to determine if these constraints are satisfied. If all of the constraints for the struct forming expression1 are true, then expression1 is true. If expression1 is true, then every item in the list forming expression2 is also true.

The second type of constraint command in the present invention is in the form:

keep for each (item-name)
  [using index (index-name)]
    in list_of_items {other_expr; . . .};

The "keep for each in" form of the constraint command applies the constraint or constraints listed in the curly brackets as "other_expr" to each item in a list. The list is given in list_of_items and each element is called item-name. Again, the "using index" option gives an "index-name" which is used to substitute for the full expression of item-name in the constraints listed. Thus, "keep for" constrains an expression which is a list of items according to one or more constraints.

The "keep for" command was not disclosed in U.S. patent application Ser. No. 09/020,792 even for scalars. Furthermore, when applied to complex structures such as a structs or lists, the "keep for" command of the present invention is particularly complex in implementation.

The constraints of the present invention can also assert conditions for the subtype of a struct instance, as determined by the generated value for a field. In this form, the constraint command includes the optional command "is a" within the constraint. By including this optional "is a" command, the constraint command is only invoked for those particular subtypes of a struct instance, rather than being globally invoked for the struct instance. In effect, the constraint command thus becomes a temporary constraint, invoked only for those subtypes of the struct instance.

The ability of the system of the present invention to include these different constraints for particularly complex field structures, and hence for particularly complex data types, is supported by the use of "roles" in a particularly preferred embodiment of the present invention.

A role is a path from the current struct instance (also referred to as "me") to a struct holding a field f which is involved in a particular constraint. Such a path determines the effect of the constraint, for example by placing a limitation on a particular field of a struct when that struct is itself a field. Thus, the "role" which the instance of that struct fills as a field causes the constraint to be invoked.

In order for constraints to be properly analyzed and invoked during test generation, all paths or roles for a particular struct element should be analyzed in relation to each constraint. Without such roles, all constraints would simply be applied globally to all fields involved in the constraint. Since each field could itself be an instance of a struct, global application of constraints would both increase the complexity of test generation and would sharply decrease the power of directed application of constraints for testing the simulated model.

In addition to explicit roles which are specified in the constraint itself, "derived roles" can optionally be inferred from a combination of constraints. For example, by specifying a series of constraints for different instances of a struct as well as constraints for the field(s) of the struct itself, a particular field in a particular instance of the struct may have a constraint "inferred", such that the value or range of values for this field in this instance is determined through constraints without explicitly including the field for this instance in a constraint command. These derived roles are preferably determined after the explicit roles have been analyzed and included for the test generation.

Next, after the roles have been determined, preferably the constraints are resolved as much as possible before running the simulation and test generation. Such resolution preferably includes first determining which constraints are fully reducible. For example, if "i==j" and "j==3", then i is set to 3. Such a constraint is fully reducible. Next, preferably "interval-reducible" constraints are analyzed. A constraint is "interval-reducible" if the set of value(s) for each constraint can only be approximated, but not fully determined. Such a situation might arise if a particular constraint implicitly prevented a certain field from taking a particular value, yet such a non-allowed value could not be determined until constraints for other fields have been fully satisfied. Finally, all remaining constraints are not analyzed until run-time for the test generation.

As previously noted, such constraint analysis and application is performed in a presentation-order independent manner, such that the order in which the constraints are presented in the test generation program is not relevant to the order in which the constraints are applied. Rather, the constraints are applied in an internal logic order, such that constraints are applied in the order in which they are most easily analyzed. Those constraints which are most easily analyzed are constraints for which more information is available, such that the range of possible values of data to which the constraint is applied can be restricted.

Two examples of such internal logic order application of constraints are given below, in order to demonstrate the power and efficacy of the method and system of the present invention. These examples are illustrative only and are not intended to be limiting in any way.

In the first example, the ranges of values for certain fields of data are restricted first. Next, the constraints are applied according to an internal logic order rather than according to the order of presentation, as described in greater detail below. The exemplary code for such a generation is as follows:

```
<'
struct data {
kind: [good, bad];
i: int[1 . . . 10];
j: int[1 . . . 10];
k: int;
keep i<j;
when good data {
   keep j==8;
};
};
extend sys {
data1: data;
keep data1.j<5;
data2: data;
keep data2.i==data1.i+2;
b: bool;
k: int;
keep b=>k<0;
keep data1.k==calc(k);
calc(p:int): int is {
   return p%7+4;
};
};
'>
```

For this exemplary code, the following analysis is performed. First, the code is statically analyzed as previously described. At static analysis the following ranges are inferred. First, from the expression "keep i<j;", the initial range for data.i is set from [1 . . . 10] to [1 . . . 9] and the initial range for data j is set from [1 . . . 10] to [2 . . . 10]. Next, from the expression "keep data1.j<5;", the initial range for sys.data1.j is set to [2 . . . 4] and the initial range for sys.data1.i is set to [1 . . . 3]. From the expression

```
"when good data {
   keep j==8;
};"
```
the initial range for sys.data1.kind is set to [bad], as sys.data1.j cannot be 8. From the expression, "keep data2.i==data1.i+2;", the initial range for sys.data2.i is set to [3 . . . 5] and the initial range for sys.data2.j is set to [4 . . . 10]. In addition, the value(s) for "sys.k" is generated before the value(s) for "sys.data1", as the field data1.k is dependent on the value(s) for sys.k in the expression "keep data1.k==calc(k);". The resulting order of generation for the "sys" fields is thus k, data1, data2, and finally b.

After generating sys.k, if the generated value is positive, the possible range of values for sys.b is set to be only FALSE, as the imply condition in the expression "keep b=>k<0;" cannot possibly be true otherwise.

When data1 is generated, the following takes place in order. First, the value for "o data1.kind" is set to be "bad". Next, the value(s) for "o data1.i" are generated from the statistically inferred range for it, which is [1 . . . 3]. The value(s) for "o data1.j" must be greater than the value(s) for "data1.i", but in the range [2 . . . 4]. The function "o calco()" is called to evaluate "sys.data1.k".

When the value(s) for "data2" are generated, "data2.kind" is generated to be either 'good' or 'bad'. If the value for "data2.kind" is generated to 'good', the range for "data2.j" is dynamically set to the value [8]. The value(s) of "data1.i" are used to calculate the value(s) for "data2.i" using the expression "keep data2.i==data1.i+2;". Then, the range of permissible values for "data2.j" is generated to be greater then the value of "data2.i", according to the expression "keep i<j;". The value(s) for "data2.k" are generated freely from the set of all integer values.

In the second example, a linked list is generated with an increasing field and with bounded differences using declarative constraints. The exemplary code for such a generation is as follows:

```
<'
struct elem {
   last :elem;
   i :int;
   keep i in [0 . . . 200]; --type constraint
};
extend sys {
   top_elem :elem;
   keep top_elem==elem_list.top();
```

```
    role constraint between a struct and a list elem
elem__list :list of elem;
keep elem__list.size()==10; --constraint on a list
keep for each in elem__list { --role constraint on list
    elems
    index!=0=>.last==prev;
    index==0=>.last==NULL;
    index==0=>.i==10;
    index>=0=>.i>prev.i;
    index>=0=>.i<=prev.i+5;
};
};
'>
```

For this exemplary code, the following analysis is performed. First, the generation of the element "sys.top__elem" is re-ordered to take place after the generation of the list "elem__list", as the range of possible value(s) for this element depends on the contents of the list. The size of the list "sys.elem.list" is generated first to be 10 according to the constraint expression "keep elem__list.size()==10;", which is a constraint on the size of the list. Next, the elements of the list are generated individually, each element of the list and the associated fields conforming to the constraints related to previously generated item(s) as previously described.

While the invention has been described with respect to a limited number of embodiments, it will be appreciated that many variations, modifications and other applications of the invention may be made.

What is claimed is:

1. A method for test generation with a plurality of constraints on at least one data structure, the at least one data structure having at least one possible value, the steps of the method consisting of:

(a) analyzing the plurality of constraints to determine an internal logic order for a sequence of constraints, each of the plurality of constraints being of a form such that the at least one possible value is selected from a non-random set containing at least one value, said internal logic order being determined according to an ability to restrict a range of potential values for said non-random set for each of the plurality of constraints after applying a previous constraint in said sequence of constraints;

(b) determining each of the plurality of constraints for the at least one data structure of the model according to said sequence of constraints; and (c) applying each of the plurality of constraints to the at least one data structure to perform the test generation.

2. The method of claim 1, wherein at least one constraint of the plurality of constraints is a flexible constraint.

3. The method of claim 2, wherein said range of potential values includes a plurality of values.

4. The method of claim 2, wherein the at least one data structure of the model is an object including at least one data element and at least one function for operating on said at least one data element.

5. The method of claim 4, wherein said object further includes at least one internal constraint being internal to said object for constraining said at least one data element of said object, and the step of applying said constraint to said object includes the steps of:

(i) applying said at least one internal constraint to said at least one data element of said object; and (ii) applying said constraint to said at least one data element of said object, such that a non-random set of at least one value for said at least one data element of said object is first determined according to said internal constraint before being determined according to said constraint.

6. The method of claim 2, wherein the at least one data structure of the model is a list of a plurality of objects.

7. The method of claim 6, wherein at least one of said plurality of objects in said list further includes at least one internal constraint being internal to said at least one of said plurality of objects for constraining said at least one data element of said at least one of said plurality of objects, and the step of applying said constraint to said list of said plurality of objects includes the steps of:

(i) applying said at least one internal constraint to said at least one data element of said at least one of said plurality of objects;

(ii) applying said constraint to said at least one data element of said at least one of said plurality of objects, such that if said internal constraint is present, a non-random set of at least one value for said at least one data element of said at least one of said plurality of objects is first determined according to said internal constraint before being determined according to said constraint; and (iii) repeating at least step (ii) for substantially all of said plurality of objects.

8. The method of claim 2, wherein the at least one data structure of the model is a list of a plurality of scalars.

9. The method of claim 8, wherein the step of applying said constraint to said list of said plurality of scalars includes the step of sequentially applying said constraint to each of said plurality of scalars in said list.

10. The method of claim 2, wherein said range of potential values includes a single value.

11. The method of claim 1, wherein the step of analyzing the plurality of constraints includes the step of identifying at least one of the plurality of constraints for being determined after at least one constraint is applied to the at least one data structure, such that at least a portion of the test generation is performed before said at least one constraint is determined.

12. The method of claim 1, wherein the plurality of constraints are analyzed according to a presentation order, said presentation order being different from said internal logic order.

\* \* \* \* \*